United States Patent
Shibuya

(10) Patent No.: US 9,889,652 B2
(45) Date of Patent: Feb. 13, 2018

(54) PIEZOELECTRIC DEVICE, INKJET HEAD, INKJET PRINTER, AND METHOD OF MANUFACTURING PIEZOELECTRIC DEVICE

(71) Applicant: Konica Minolta, Inc., Chiyoda-ku, Tokyo (JP)

(72) Inventor: Kazuki Shibuya, Hino (JP)

(73) Assignee: KONICA MINOLTA, INC., Tokyo (JP)

( * ) Notice: Subject to any disclaimer, the term of this patent is extended or adjusted under 35 U.S.C. 154(b) by 0 days.

(21) Appl. No.: 15/032,449

(22) PCT Filed: Oct. 10, 2014

(86) PCT No.: PCT/JP2014/077159
§ 371 (c)(1),
(2) Date: Apr. 27, 2016

(87) PCT Pub. No.: WO2015/064341
PCT Pub. Date: May 7, 2015

(65) Prior Publication Data
US 2016/0250855 A1    Sep. 1, 2016

(30) Foreign Application Priority Data

Oct. 29, 2013  (JP) .................................. 2013-224311

(51) Int. Cl.
*B41J 2/14*     (2006.01)
*H01L 41/31*   (2013.01)
(Continued)

(52) U.S. Cl.
CPC ....... *B41J 2/14209* (2013.01); *B41J 2/14233* (2013.01); *B41J 2/161* (2013.01);
(Continued)

(58) Field of Classification Search
CPC .. B41J 2/14201; B41J 2/14209; B41J 2/1607; B41J 2/1646; B41J 2/1628; B41J 2/1623;
(Continued)

(56) References Cited

U.S. PATENT DOCUMENTS 7,033,001 B2 *  4/2006  Fujii ................... B41J 2/14233
                                                      310/363

FOREIGN PATENT DOCUMENTS

CN      100345320 C    10/2007
JP      H11191646 A     7/1999
(Continued)

OTHER PUBLICATIONS

International Search Report corresponding to Application No. PCT/JP2014/077159; dated Dec. 9, 2014, with English translation.
(Continued)

*Primary Examiner* — Geoffrey Mruk
(74) *Attorney, Agent, or Firm* — Cantor Colburn LLP

(57) ABSTRACT

An actuator as a piezoelectric device has a bonding layer including titanium, a lower electrode including platinum, a piezoelectric thin film, and an upper electrode formed in this order on a substrate. Ti particles precipitate from the bonding layer onto the lower electrode. Pt that forms the lower electrode has a crystal grain size of 75 nm to 150 nm.

20 Claims, 6 Drawing Sheets

(51) Int. Cl.
*H01L 41/29* (2013.01)
*B41J 2/16* (2006.01)
*H01L 41/047* (2006.01)
*H01L 41/08* (2006.01)
*H01L 41/09* (2006.01)
*H01L 41/319* (2013.01)
*H01L 41/187* (2006.01)
*H01L 41/314* (2013.01)

(52) U.S. Cl.
CPC ........... *B41J 2/1607* (2013.01); *B41J 2/1623* (2013.01); *B41J 2/1628* (2013.01); *B41J 2/1645* (2013.01); *B41J 2/1646* (2013.01); *H01L 41/0477* (2013.01); *H01L 41/0815* (2013.01); *H01L 41/0973* (2013.01); *H01L 41/1876* (2013.01); *H01L 41/29* (2013.01); *H01L 41/31* (2013.01); *H01L 41/314* (2013.01); *H01L 41/319* (2013.01)

(58) Field of Classification Search
CPC ...... B41J 2/161; B41J 2/14233; B41J 2/1645; H01L 41/314; H01L 41/1876; H01L 41/319; H01L 41/0815; H01L 41/0973; H01L 41/0477; H01L 41/29
See application file for complete search history.

(56) References Cited

FOREIGN PATENT DOCUMENTS

| | | | |
|---|---|---|---|
| JP | 2000252544 A | 9/2000 | |
| JP | 2000299513 A | 10/2000 | |
| JP | 2003188432 A | 7/2003 | |
| JP | 2004186646 A | 7/2004 | |
| JP | 2007281238 A | 10/2007 | |
| JP | 2008042069 A | 2/2008 | |
| JP | 2013-184313 | * 9/2013 | ............... B41J 2/16 |
| JP | 2013184313 A | 9/2013 | |
| WO | 2012165110 A1 | 12/2012 | |

OTHER PUBLICATIONS

Written Opinion of the International Searching Authority corresponding to Application No. PCT/JP2014/077159; dated Dec. 9, 2014, with English translation.

SIPO First Office Action for corresponding Chinese Application No. 201480058482.4; dated May 27, 2017.

Notice of Reasons for Rejection for corresponding JP Patent Application No. 2015-544906; dated Sep. 5, 2017.

\* cited by examiner

PIEZOELECTRIC DEVICE, INKJET HEAD, INKJET PRINTER, AND METHOD OF MANUFACTURING PIEZOELECTRIC DEVICE

This is the U.S. national stage of application No. PCT/JP2014/077159, filed on Oct. 10, 2014. Priority under 35 U.S.C. § 119(a) and 35 U.S.C. § 365(b) is claimed from Japanese Application No. 2013-224311, filed Oct. 29, 2013, the disclosure of which is also incorporated herein by reference.

TECHNICAL FIELD

The present invention relates to a piezoelectric device having a bonding layer including Ti (titanium), a lower electrode including Pt (platinum), a piezoelectric thin film, and an upper electrode, which are formed in this order on a substrate. The present invention also relates to an inkjet head including the piezoelectric device, an inkjet printer including the inkjet head, and a method of manufacturing the piezoelectric device.

BACKGROUND ART

Piezoelectric materials such as PZT (lead zirconate titanate) have been used to form piezoelectric devices for use in actuators and sensors. Traditionally, bulk piezoelectric materials have been used. In recent years, thin film piezoelectric materials (piezoelectric thin films) have been studied and used to meet the need for a reduction in size and thickness. Particularly when a piezoelectric device is used as an actuator for an inkjet head, it is important to make the piezoelectric device smaller for each nozzle, because nozzles must be arranged at high density for high-definition image printing.

Methods for depositing piezoelectric thin films include sputtering and sol-gel techniques. Piezoelectric thin films are deposited on a substrate layer and therefore strongly influenced by the material, orientation, and other properties of the substrate layer. In order to improve the properties of piezoelectric thin films, therefore, various methods are used, such as control of the orientation of a lower electrode used as the substrate and placement of an orientation control layer between a lower electrode and a piezoelectric thin film.

A precious metal such as Pt, Au (gold), or Ir (iridium) is often used to form the lower electrode. In addition, a bonding layer including Ti or TiOx (titanium oxide) is often provided between the lower electrode and the substrate (such as an oxidized silicon substrate) in order to increase the bonding between them. For example, Patent Literature 1 discloses a piezoelectric device having a silicon oxide film, a titanium oxide film (bonding layer), a lower electrode including Pt, a PZT film (piezoelectric thin film), and an upper electrode, which are stacked in this order on a silicon substrate.

According to Patent Literature 1, Ti is deposited in the form of islands on the lower electrode by sputtering, and the PZT film is deposited on the Ti islands. It is suggested that when Ti is deposited in the form of islands on the lower electrode, the Ti islands can serve as crystal nuclei to control the orientation of PZT during the deposition of the PZT film on the lower electrode, so that the resulting PZT can have improved crystallinity (orientation) and thus improved piezoelectric properties.

For example, Patent Literature 2 also discloses such a method including depositing seed crystals (for serving as crystal nuclei) in the form of islands on a lower electrode and then depositing a piezoelectric thin film thereon. According to Patent Literature 2, after a bonding layer including Ti and a lower electrode including Pt are formed in this order on a substrate, the substrate is annealed in an oxygen atmosphere so that Ti is diffused into Pt and TiOx seeds are distributed in the form of islands on the lower electrode.

Actually, in this regard, even without annealing in the oxygen atmosphere, seed crystals (Ti) can precipitate on the lower electrode depending on the settings of the deposition conditions such as the substrate temperature during Pt deposition, because a sufficient amount of oxygen exists for the amount of the atoms on the thin film surface even when the pressure is around the back pressure of the vacuum system ($10^{-3}$ Pa to $10^{-5}$ Pa).

Unfortunately, it is difficult to control the necessary amount of Ti by sputtering in the method of forming seed crystals (Ti) on the lower electrode by sputtering as disclosed in Patent Literature 1.

In this regard, Patent Literature 2 discloses that the ratio of seed crystals (TiOx) to Pt on the lower electrode surface is about 1.5% by atom. It is difficult to control the amount of Ti to a level of around 1.5% by atom by sputtering although the crystallinity of a perovskite crystal, such as PZT, deposited on the lower electrode significantly depends on the ratio of the seed crystals. Even when one atom thick layer of seed crystals are deposited, the deposition time is about few seconds although it depends on the supplied power and other conditions. Therefore, the deposition time would be shorter when the deposition on the surface is performed at a ratio of 1.5% by atom. Using sputtering, it is very difficult to form a uniform film on a substrate in such a short deposition time. If the resulting film is not uniform, the productivity will significantly decrease.

Alternatively, Ti can be precipitated from the bonding layer onto the lower electrode. In this method, appropriate control of the amount of Ti precipitation can be more easily achieved by the control of the Pt deposition temperature than in the method of forming seed crystals by sputtering. Therefore, this method is advantageous in that it can easily deposit Ti uniformly on the substrate.

CITATION LIST

Patent Literatures

Patent Literature 1: JP 11-191646 A (see claims 1 and 8, paragraphs [0035], [0063], [0065], and [0066], and FIG. 1)

Patent Literature 2: JP 2003-188432 A (see claim 1, paragraph [0019], and FIG. 1)

SUMMARY OF INVENTION

Technical Problem

Meanwhile, as the surface of the lower electrode becomes smooth and highly crystalline (e.g., as the crystal grain size becomes large), it becomes easy to grow PZT crystals on the surface and to improve the piezoelectric properties of PZT. However, there is a tradeoff between the amount of the Ti precipitation and the crystallinity of the lower electrode, which means that as the amount of the Ti precipitation increases, the crystallinity of the lower electrode decreases. This would be because when Ti precipitates from the bonding layer onto the surface of the lower electrode, Ti passes through the inside of the lower electrode, so that as the amount of the Ti precipitation increases, the crystal growth of the lower electrode is more inhibited by Ti. Therefore, the amount of the Ti precipitation should be reduced in order to improve the crystallinity of the lower electrode. In such a case, however, the effect of improving the piezoelectric properties by Ti precipitation cannot be obtained.

Therefore, the conventional method of allowing Ti to precipitate on the lower electrode cannot sufficiently achieve, at the same time, the effect of improving the properties of the piezoelectric thin film by Ti precipitation and the effect of improving the properties of the piezoelectric thin film based on the crystallinity of the lower electrode. In order to sufficiently achieve these effects at the same time, it is necessary to define the appropriate range of the Pt crystal grain size, which has an influence on the crystallinity of the lower electrode.

The present invention has been made to solve the above problems, and it is an object of the prevention invention to provide a piezoelectric device that can sufficiently achieve, at the same time, the effect of improving the properties of the piezoelectric thin film by the precipitation of Ti from the bonding layer onto the lower electrode and the effect of improving the properties of the piezoelectric thin film based on the crystallinity of the lower electrode, to provide an inkjet head having such a piezoelectric device, to provide an inkjet printer having such an inkjet head, and to provide a method of manufacturing such a piezoelectric device.

Solution to Problem

An aspect of the present invention is directed to a piezoelectric device including: a substrate; a bonding layer including titanium; a lower electrode including platinum; a piezoelectric thin film; and an upper electrode, wherein the bonding layer, the lower electrode, the piezoelectric thin film, and the upper electrode are formed in this order on the substrate, titanium from the bonding layer forms a precipitate on the lower electrode, and the platinum that forms the lower electrode has a crystal grain size of 75 nm to 150 nm. Another aspect of the present invention is directed to a method of manufacturing a piezoelectric device, the method including the steps of: forming a bonding layer including titanium on a substrate; forming a lower electrode including platinum on the bonding layer; forming a piezoelectric thin film on the lower electrode; and forming an upper electrode on the piezoelectric thin film, wherein the step of forming the lower electrode includes forming the lower electrode in such a way that titanium is precipitated from the bonding layer onto the lower electrode and the platinum has a crystal grain size of 75 nm to 150 nm Advantageous Effects of Invention Ti is precipitated from the bonding layer onto the lower electrode, and Pt that forms the lower electrode has a crystal grain size of 75 nm to 150 nm. These features make it possible to sufficiently achieve, at the same time, the effect of improving the properties of the piezoelectric thin film by Ti precipitation and the effect of improving the properties of the piezoelectric thin film based on the crystallinity of the lower electrode.

DESCRIPTION OF EMBODIMENTS

An embodiment of the present invention will be described below with reference to the drawings. In the description, any interval of values denoted by the expression "A to B" represents the range of values including A and B as lower and upper bounds.

[Structure of Inkjet Printer]

Figure 1:
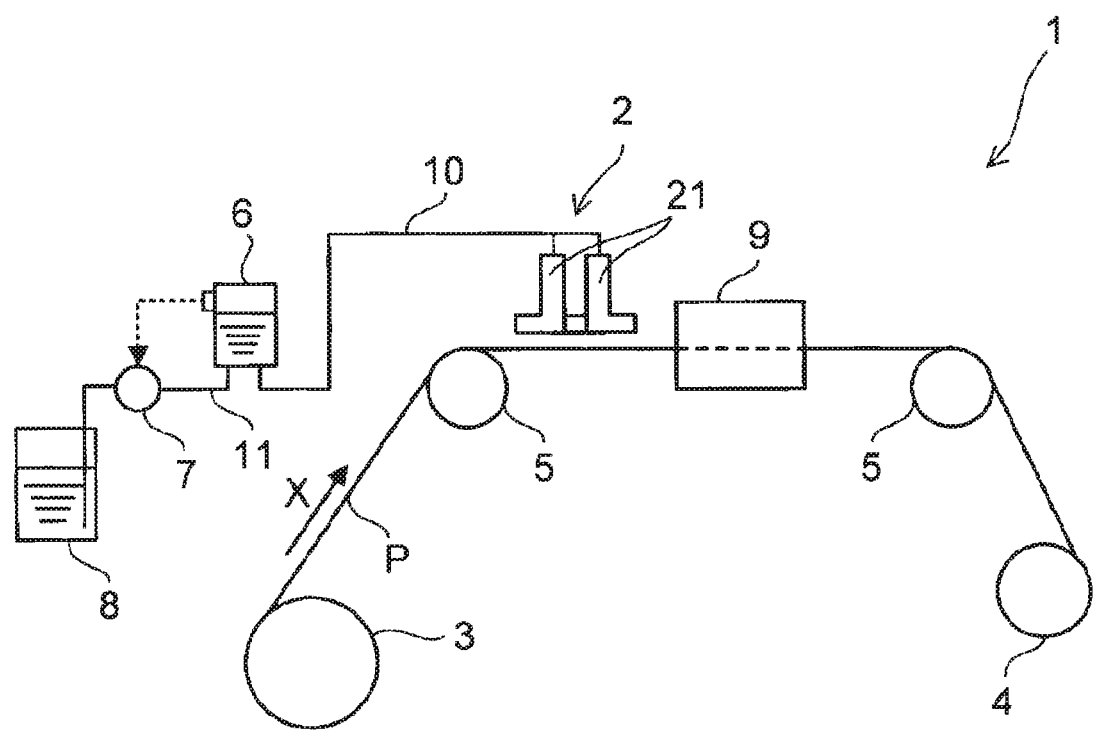
FIG. 1 is a schematic diagram showing the general structure of an inkjet printer according to an embodiment of the present invention.

FIG. 1 is a schematic diagram showing the general structure of an inkjet printer 1 of an embodiment. The inkjet printer 1 is what is called a line head inkjet recording apparatus having an inkjet head unit 2 in which inkjet heads 21 are arranged in line in the widthwise direction of a recording medium.

The inkjet printer 1 includes the inkjet head unit 2, a feed roll 3, a take-up roll 4, two back rolls 5, 5, an intermediate tank 6, a liquid feed pump 7, a reservoir tank 8, and a fixing mechanism 9.

The inkjet head unit 2, which is placed in the vicinity of one back roll 5, is configured to perform image formation (drawing) by ejecting ink from the inkjet heads 21 to a recording medium P based on image data. The inkjet heads 21 will be described in detail later.

The feed roll 3, the take-up roll 4, and each back roll 5 are cylindrical members rotatable about their axes. A long recording medium P is wound in layers on the circumference of the feed roll 3, which is adapted to feed the long recording medium P toward the position facing the inkjet head unit 2. The feed roll 3 is rotated by drive means (not shown) such as a motor to feed the recording medium P in the direction X in FIG. 1.

The take-up roll 4 is adapted to wind the recording medium P on its circumference when ink is ejected from the inkjet head unit 2 onto the recording medium P fed from the feed roll 3.

Each back roll 5 is placed between the feed roll 3 and the take-up roll 4. One back roll 5 located upstream with respect to the direction of feed of the recording medium P is adapted to support the recording medium P around part of its circumference and feed the recording medium P toward the position facing the inkjet head unit 2 while the recording medium P is fed by the feed roll 3. The other back roll 5 is adapted to support the recording medium P around part of its circumference and feed the recording medium P toward the take-up roll 4 from the position facing the inkjet head unit 2.

The intermediate tank 6 is adapted to temporarily contain the ink supplied from the reservoir tank 8. The intermediate tank 6 is connected to a plurality of ink tubes 10 and configured to supply the ink to each inkjet head 21 while controlling the back pressure of the ink in each inkjet head 21.

The liquid feed pump 7, which is provided at a midpoint of a supply pipe 11, is adapted to supply the ink from the reservoir tank 8 to the intermediate tank 6. The ink contained in the reservoir tank 8 is pumped and supplied to the intermediate tank 6 through the supply pipe 11 by the liquid feed pump 7.

The fixing mechanism 9 is adapted to fix the ink on the recording medium P after the ink is ejected from the inkjet head unit 2 to the recording medium P. The fixing mechanism 9 includes a heater for fixing the ink by heating after the ink is ejected to the recording medium P or includes a UV lamp for curing the ink by applying UV (ultraviolet rays) to the ink ejected on the recording medium P.

In the printer with these features, the recording medium P being fed from the feed roll 3 is fed by the back roll 5 to the position facing the inkjet head unit 2, at which the ink is ejected from the inkjet head unit 2 onto the recording medium P. Subsequently, the ink deposited on the recording medium P is fixed by the fixing mechanism 9, and the recording medium P with the fixed ink thereon is wound by the take-up roll 4. In the line head inkjet printer 1 with these features, the inkjet head unit 2 is kept stationary while an image is formed on the recording medium P with the ink ejected onto the recording medium P being fed.

Alternatively, the inkjet printer 1 may be configured to form an image on a recording medium by means of a serial head system. The serial head system is a system in which while a recording medium is fed, an image is formed with ink ejected from inkjet heads being moved in a direction perpendicular to the direction of feed of the recording medium.

[Structure of Inkjet Head]

Figure 2:
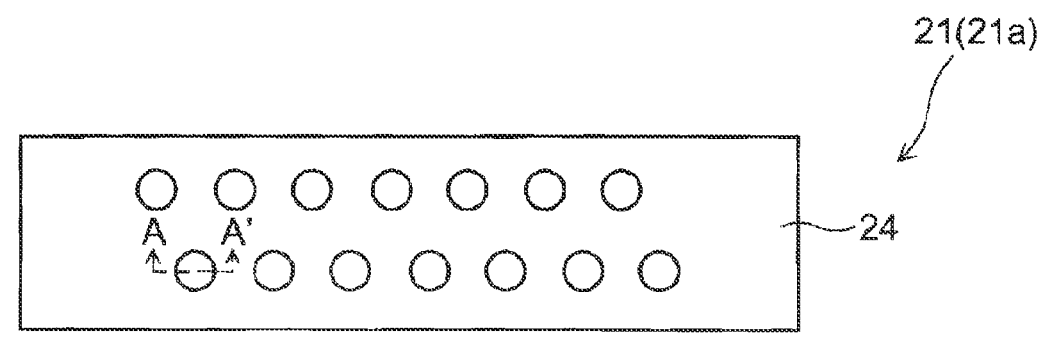
FIG. 2 is a plan view showing the general structure of an actuator in an inkjet head of the inkjet printer and a cross-sectional view along the line indicated by the arrows A and A' in the plan view.
Figure 2:
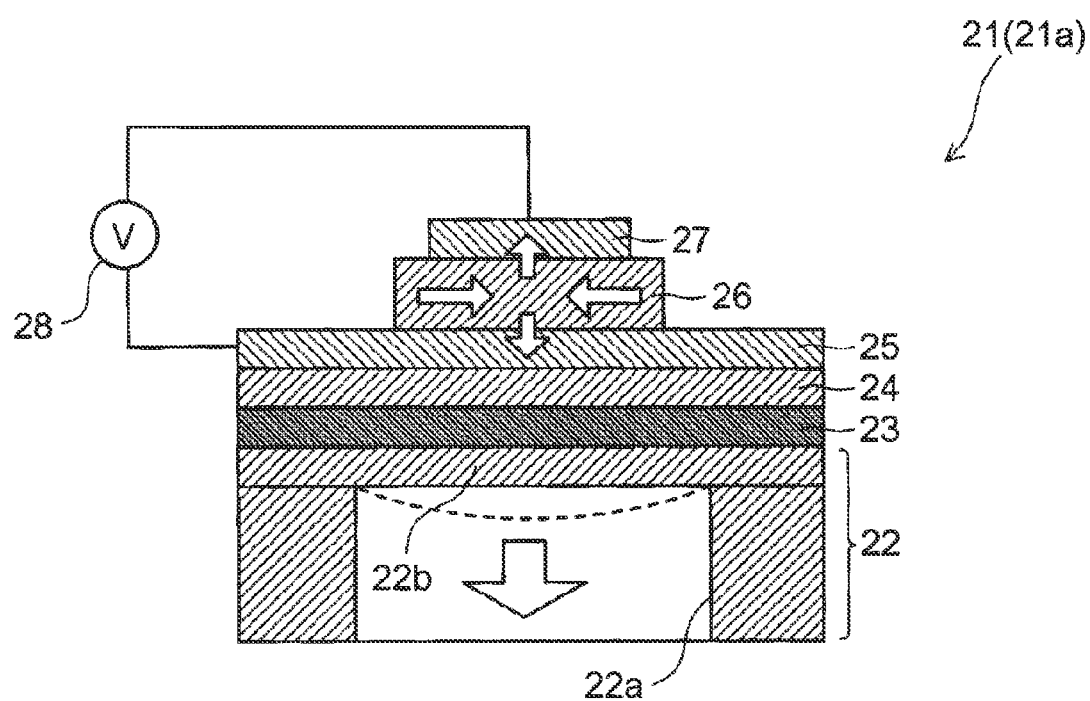
Figure 3:
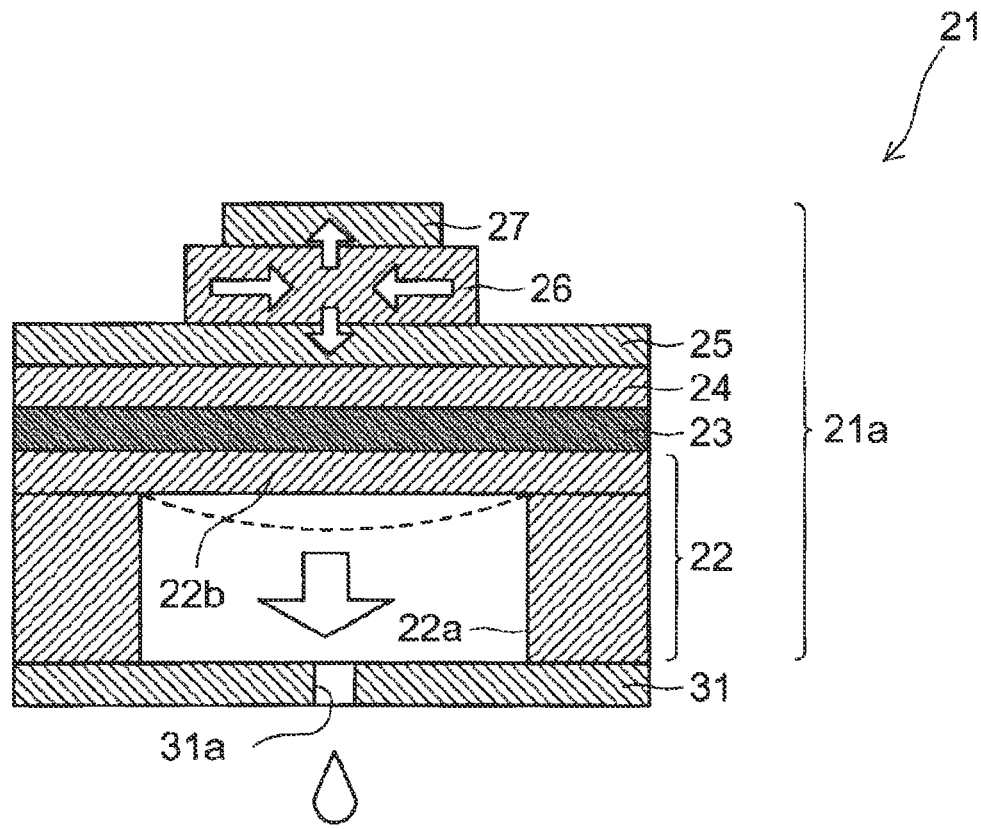
FIG. 3 is a cross-sectional view of the inkjet head.

Next, the structure of the inkjet head 21 mentioned above will be described. FIG. 2 includes a plan view showing the general structure of an actuator 21a in the inkjet head 21 and a cross-sectional view along the line indicated by the arrows A and A' in the plan view. FIG. 3 is a cross-sectional view of the inkjet head 21 including the actuator 21a of FIG. 2 and a nozzle substrate 31 joined to the actuator 21a.

The actuator 21a is a piezoelectric device including a substrate 22 and a thermal oxide film 23, a bonding layer 24, a lower electrode 25, a piezoelectric thin film 26, and an upper electrode 27 formed in this order on the substrate 22, in which the substrate 22 has a plurality of pressure chambers 22a (openings).

The substrate 22 includes a semiconductor substrate including elemental monocrystalline Si (silicon) with a thickness of, for example, about 300 to about 500 µm or includes a silicon-on-insulator (SOI) substrate. FIG. 2 shows a case where the substrate 22 includes a SOI substrate. The SOI substrate includes two Si substrates joined with an oxide film interposed therebetween. In the substrate 22, the upper wall of the pressure chamber 22a forms a diaphragm 22b as a follower film, which is displaced (oscillated) according to the movement (expansion and contraction) of the piezoelectric thin film 26 to apply a pressure to the ink in the pressure chamber 22a.

The thermal oxide film 23 includes, for example, about 0.1-µm-thick $SiO_2$ (silicon oxide), which is formed to protect and insulate the substrate 22.

The bonding layer 24 includes Ti (titanium), which is formed to improve the bonding between the thermal oxide film 23 and the lower electrode 25. The thickness of the bonding layer 24 is, for example, about 5 nm.

The lower electrode 25 includes Pt (platinum), which is a common electrode provided in common for the plurality of pressure chambers 22a. The thickness of the lower electrode 25 is, for example, about 50 nm The piezoelectric thin film 26 includes, for example, PZT (lead zirconate titanate), which is provided for each pressure chamber 22a. PZT is a solid solution of PTO (lead titanate ($PbTiO_3$)) and PZO (lead zirconate ($PbZrO_3$)). The thickness of the piezoelectric thin film 26 is, for example, from 3 to 5 µm.

Figure 4:
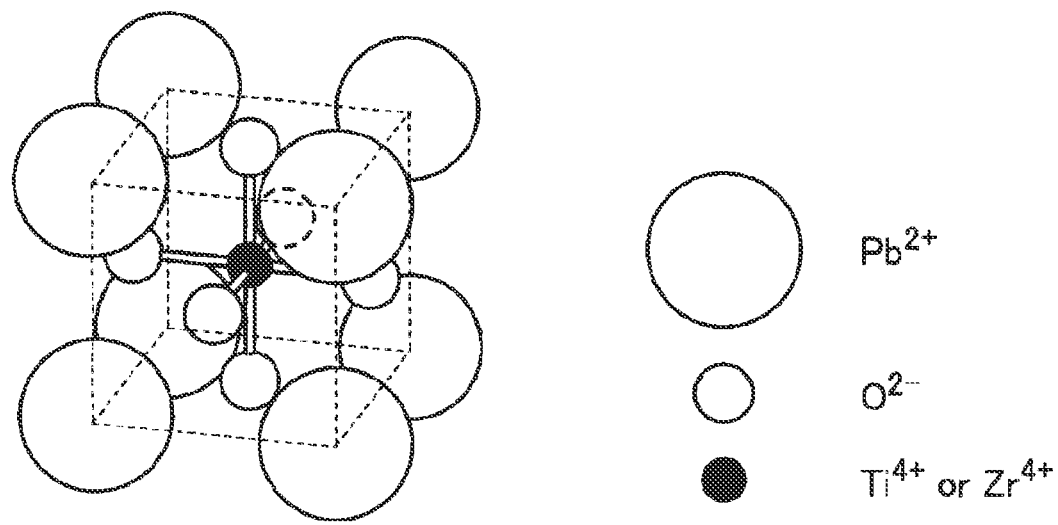
FIG. 4 is a diagram schematically showing the crystal structure of PZT used to form the piezoelectric thin film of the actuator.

FIG. 4 schematically shows the crystal structure of PZT. PZT has a perovskite crystal structure, which shows a high piezoelectric effect. When having a perovskite crystal structure, for example, a $Pb(Zr_x, Ti_{1-x})O_3$ tetragonal crystal system has Pb atoms (Pb ions) each at the apex of the tetragonal crystal system, a Ti or Zr atom (a Ti or Zr ion) at the body center, and O atoms (O ions) each at the face center.

The upper electrode 27 is an individual electrode provided for each pressure chamber 22a, which includes a stack of Ti and Pt layers. The Ti layer is formed to improve the bonding between the piezoelectric thin film 26 and the Pt layer. The thickness of the Ti layer is, for example, about 0.02 µm. The thickness of the Pt layer is, for example, from about 0.1 to about 0.2 µm. The upper electrode 27 is provided so as to allow the piezoelectric thin film 26 to be placed between the lower and upper electrodes 25 and 27.

The upper and lower electrodes 25 and 27 are connected to a driving circuit 28. The piezoelectric thin film 26 is driven by a voltage (driving signal) applied across the lower and upper electrodes 25 and 27 from the driving circuit 28.

The nozzle substrate 31 is joined to an opposite side of the pressure chamber 22a from the diaphragm 22b. The nozzle substrate 31 has an ejection hole (nozzle hole) 31a for ejecting the ink in the form of ink droplets from the pressure chamber 22a to the outside. The pressure chamber 22a contains the ink supplied from the intermediate tank 6.

In this structure, when a voltage is applied across the lower and upper electrodes 25 and 27 from the driving circuit 28, the piezoelectric thin film 26 is expanded or contracted in a direction perpendicular to the thickness direction (in a direction parallel to the surface of the substrate 22) depending on the potential difference between the lower and upper electrodes 25 and 27. Therefore, a difference in length occurs between the piezoelectric thin film 26 and the diaphragm 22b to cause the diaphragm 22b to have a certain curvature and to cause the diaphragm 22b to be displaced (to bend and oscillate) in the thickness direction.

Therefore, when the ink is contained in the pressure chamber 22a, the oscillation of the diaphragm 22b transmits pressure waves to the ink in the pressure chamber 22a, so that the ink is ejected in the form of ink droplets from the pressure chamber 22a to the outside through the ejection hole 31a.

[Details of the Bonding Layer and the Lower Electrode]

Figure 5:
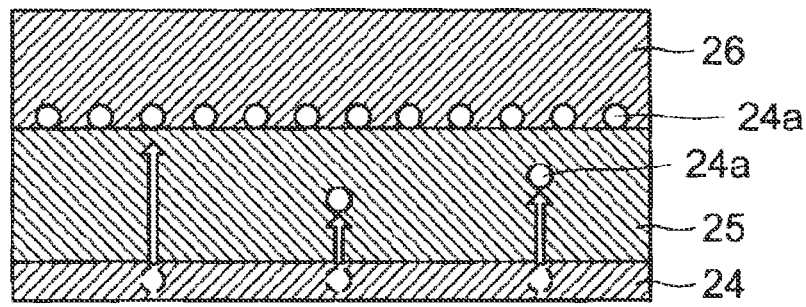
FIG. 5 is a cross-sectional view showing part of the actuator on an enlarged scale.

FIG. 5 is a cross-sectional view showing, on an enlarged scale, part of the inkjet head 21 (actuator 21a), which includes the bonding layer 24, the lower electrode 25, and the piezoelectric thin film 26. In an embodiment, Ti is precipitated in the form of particles 24a, which form islands, from the bonding layer 24 onto the lower electrode 25 (on the side where the piezoelectric thin film 26 is deposited). This results from the oxidation of Ti from the bonding layer 24, which is catalyzed by Pt in the lower electrode 25 during the high-temperature deposition of the lower electrode 25 described below. During the deposition of the lower electrode 25, Ti from the bonding layer 24 is allowed to pass through the lower electrode 25 and to precipitate on its surface. As shown in the drawing, therefore, Ti from the bonding layer 24 also exists in the form of particles 24a inside the lower electrode 25.

If Ti is deposited in the form of islands on the lower electrode 25, for example, by sputtering, the content of Ti in the lower electrode 25 should be significantly lower than that in the case where Ti is precipitated from the bonding layer 24 onto the lower electrode 25 as mentioned above (because Ti is not allowed to pass through the inside of the lower electrode 25 when Ti is deposited by sputtering). Therefore, the elemental composition analysis of the inside of the lower electrode 25 (the analysis of the Ti content) can determine whether Ti (particles 24a) present on the lower electrode 25 is derived by precipitation from the bonding layer 24 or deposited by sputtering.

In an embodiment, Pt that forms the lower electrode 25 has a crystal grain size of 75 nm to 150 nm. The crystal grain size of Pt is defined as the average of crystal grain sizes d (nm) each calculated as the square root ($\sqrt{A}$) of an area A calculated from the grain boundary of Pt. The grain boundary can be determined, for example, by observation with a scanning electron microscope (SEM). The Pt crystal grain size can be controlled by the Pt deposition conditions (e.g., deposition temperature).

When Ti is precipitated in the form of particles 24a from the bonding layer 24 onto the lower electrode 25 as shown in FIG. 5, the Ti precipitates on the lower electrode 25 can serve as crystal nuclei for crystal growth of the piezoelectric thin film 26 during the deposition of the piezoelectric thin film 26, so that the resulting piezoelectric thin film 26 can have improved crystallinity (orientation). In addition, since Pt in the lower electrode 25 has a crystal grain size of 75 nm to 150 nm, crystals in the desired orientation (e.g., the (100) orientation) can be easily grown for the piezoelectric thin film 26 according to the crystallinity of the lower electrode 25, so that the resulting piezoelectric thin film 26 can have improved crystallinity (orientation).

In other words, even when Ti is precipitated from the bonding layer 24 onto the lower electrode 25, the effect of improving the properties of the piezoelectric thin film 26 by the precipitation of Ti and the effect of improving the properties of the piezoelectric thin film 26 based on the crystallinity of the lower electrode 25 can be sufficiently achieved at the same time by setting the Pt crystal grain size of the lower electrode 25 in the appropriate range. This makes it possible to provide an actuator 21a with a large piezoelectric displacement.

[Method of Manufacturing Inkjet Head]

Figure 6:
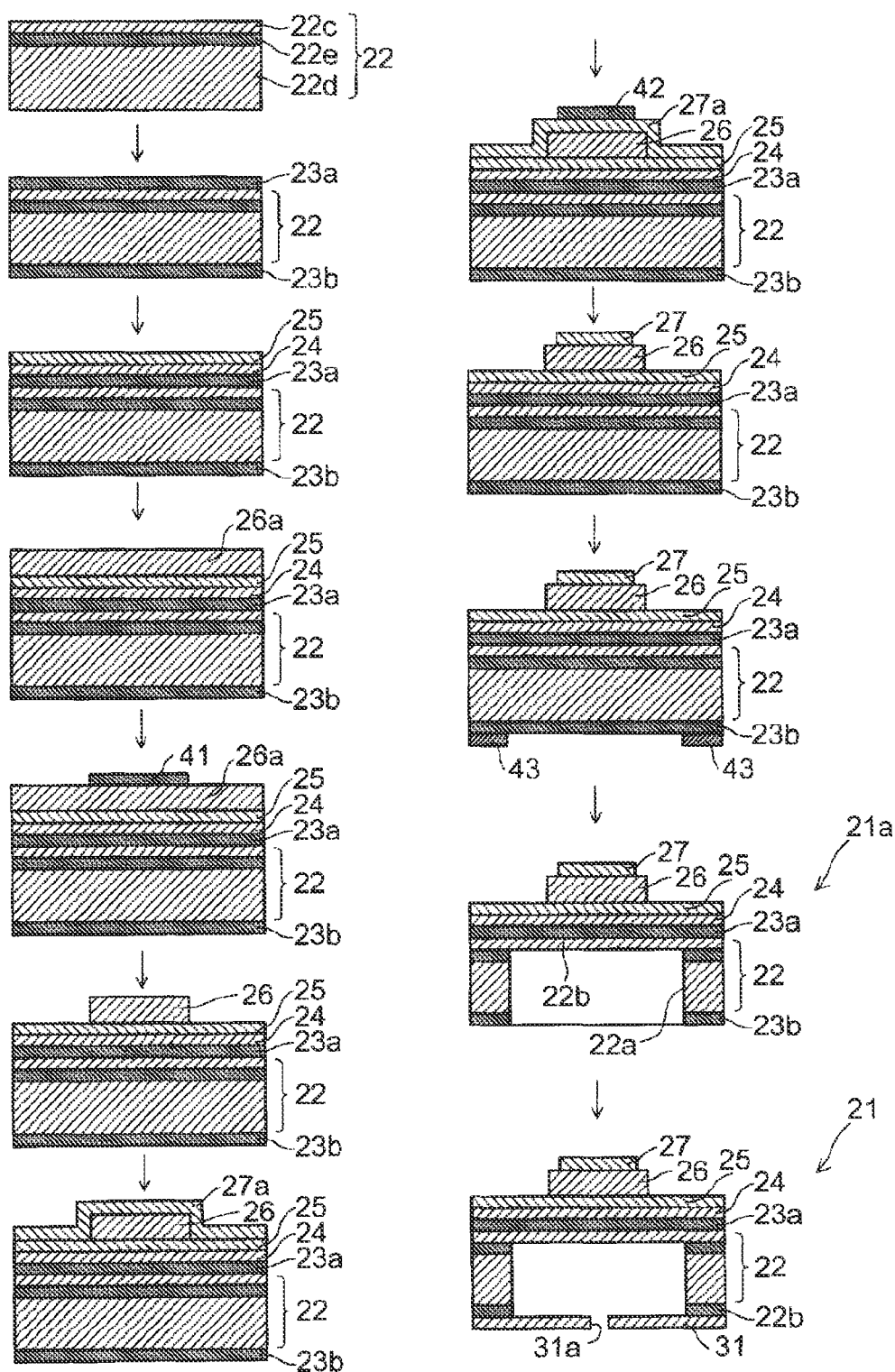
FIG. 6 is a cross-sectional view showing a process of manufacturing the inkjet head.

Next, a method of manufacturing the inkjet head 21 of an embodiment will be described below. FIG. 6 is a cross-sectional view showing a process of manufacturing the inkjet head 21 of an embodiment.

First, a substrate 22 is provided. The substrate 22 may be a crystal silicon (Si) substrate often used in micro electro mechanical systems (MEMSs). In this case, the substrate 22 used has a SOI structure in which two Si substrates 22c and 22d are joined with an oxide film 22e interposed therebetween.

The substrate 22 is placed in a heating furnace and held at about 1,500° C. for a certain period of time so that thermal oxide films 23a and 23b of $SiO_2$ (0.1 μm in thickness) are formed on the surfaces of the Si substrates 22c and 22d, respectively. Subsequently, after the substrate 22 is cooled to room temperature, a bonding layer 24 (5 nm in thickness) is formed on one thermal oxide film 23a by Ti sputtering. Subsequently, a lower electrode 25 (50 nm in thickness) is formed on the bonding layer 24 by Pt sputtering, and Ti is precipitated from the bonding layer 24 onto the lower electrode 25 (see FIG. 5). In this step, the lower electrode 25 is deposited at a temperature of 500° C.

Subsequently, a PZT layer 26a as a displacement film is deposited on the lower electrode 25 by sputtering. In this step, PZT is deposited at a temperature of 600° C. Subsequently, a photosensitive resin 41 is applied to the substrate 22 by spin coating and then exposed to light through a mask. Unnecessary part of the photosensitive resin 41 is then removed by etching, so that the pattern for the formation of a piezoelectric thin film 26 is transferred. Subsequently, the layer 26a is patterned by reactive ion etching using the photosensitive resin 41 as a mask, so that a piezoelectric thin film 26 (5 μm in thickness) is formed.

Subsequently, a layer 27a is formed over the piezoelectric thin film 26 by sequentially depositing a Ti layer and a Pt layer on the lower electrode 25 by sputtering. Subsequently, a photosensitive resin 42 is applied to the layer 27a by spin coating and then exposed to light through a mask. Unnecessary part of the photosensitive resin 42 is then removed by etching, so that the pattern for the formation of an upper electrode 27 is transferred. Subsequently, the layer 27a is patterned by reactive ion etching using the photosensitive resin 42 as a mask, so that an upper electrode 27 (about 0.2 μm in thickness) is formed.

Subsequently, a photosensitive resin 43 is applied to the back surface of the substrate 22 (the thermal oxide film 22d side) by spin coating and then exposed to light through a mask. Unnecessary part of the photosensitive resin 43 is then removed by etching, so that the pattern for the formation of a pressure chamber 22a is transferred. Subsequently, the substrate 22 is patterned by reactive ion etching using the photosensitive resin 43 as a mask, so that a pressure chamber 22a is formed.

The substrate 22 and a nozzle substrate 31 having an ejection hole 31a are then joined together with an adhesive or the like. In this way, an inkjet head 21 is completed. Alternatively, an intermediate glass sheet having a through hole at a position corresponding to that of the ejection hole 31a may be used, and the thermal oxide film 22b may be removed, which may be followed by anodic bonding between the substrate 22 and the intermediate glass sheet and anodic bonding between the intermediate glass sheet and the nozzle substrate 31, respectively. In this case, the three components (the substrate 22, the intermediate glass sheet, and the nozzle substrate 31) can be bonded with no adhesive.

In the step of forming the lower electrode 25, as the Pt deposition temperature for the lower electrode 25 is increased, the oxidation of Ti from the bonding layer 24 is accelerated, and the amount of Ti precipitation on the lower electrode 25 is increased. In many conventional cases, therefore, Pt is deposited at a temperature of, for example, about 300 to about 400° C. However, Pt crystal growth more actively proceeds at higher temperatures, and therefore, Pt should be deposited at higher temperatures in order to obtain a larger Pt crystal grain size. In order to satisfy both requirements, the amount of precipitation of Ti from the bonding layer 24 onto the lower electrode 25 should be reduced by reducing the thickness of the bonding layer 24. Alternatively, the amount of Ti precipitation can also be reduced by increasing the thickness of the lower electrode 25.

In an embodiment, therefore, the thickness of the bonding layer 24 and the thickness of the lower electrode 25 are each selected so as to set t1/t2 in the range of 1/17 to 1/8 (t1/t2=1/17 to 1/8), wherein t1 represents the thickness (nm) of Ti in the bonding layer 24, and t2 represents the thickness (nm) of Pt in the lower electrode 25. In the example described above, t1/t2=5/50=1/10, which falls into the desired range. As a result, even when Pt is deposited at a substrate temperature of 500° C., island-like Ti seed crystals are precipitated on the lower electrode 25 and the lower electrode 25 has improved crystallinity, so that the piezoelectric thin film 26 deposited on the lower electrode 25 can have improved crystallinity.

In other words, when the thickness of the bonding layer 24 and the thickness of the lower electrode 25 are each appropriately controlled, Ti can be precipitated from the bonding layer 24 onto the lower electrode 25 in the step of forming the lower electrode 25, and the lower electrode 25 can be formed so as to have a Pt crystal grain size of 75 nm to 150 nm. As a result, the effect of improving the properties of the piezoelectric thin film 26 by Ti precipitation and the effect of improving the properties of the piezoelectric thin film 26 based on the crystallinity of the lower electrode 25 can be sufficiently achieved at the same time.

In the above case, Pt is deposited at a temperature of 500° C. At a deposition temperature higher than this temperature, the diffusion of Ti from the bonding layer 24 to the lower electrode 25 can be accelerated, so that the amount of Ti precipitation on the lower electrode 25 can be increased to an extent under normal conditions. In an embodiment, however, the thickness of Ti in the bonding layer 24 as a supply source for island-like Ti seed crystals is not so large, in the first place. It is therefore suggested that the amount of precipitation of island-like Ti seed crystals will not increase so much even when the lower electrode 25 is deposited at a higher temperature. It is rather suggested that when the Pt deposition temperature is increased, the crystallinity of Pt can be improved, so that the piezoelectric thin film 26 deposited on the lower electrode 25 can have improved piezoelectric properties. However, there is a concern that if the lower electrode 25 is deposited at a temperature higher than 700° C., large thermal stress may occur due to the difference in temperature from room temperature, so that Pt hillocks (projections) may precipitate on the surface of the lower electrode 25, which may reduce the bonding when the actuator is driven.

Therefore, the lower electrode 25 deposition temperature should preferably be from 500° C. to 700° C. in order to improve the properties of the piezoelectric thin film 26 and to improve the bonding.

When the lower electrode 25 is deposited by sputtering, the Pt deposition temperature can be controlled in the above range, which makes it possible to keep the Pt crystal grain size in the desired range and to allow Ti to precipitate from the bonding layer 24 onto the lower electrode 25. Such a Ti precipitation process does not need any additional step, such as an annealing step or Ti sputtering, so that cost reduction and productivity improvement can be expected due to the reduction in the number of steps, in contrast to the conventional technique where seed crystals are precipitated by annealing in an oxygen atmosphere or Ti is deposited by sputtering after the deposition of the lower electrode.

[Another Structure of Inkjet Head]

Figure 7:
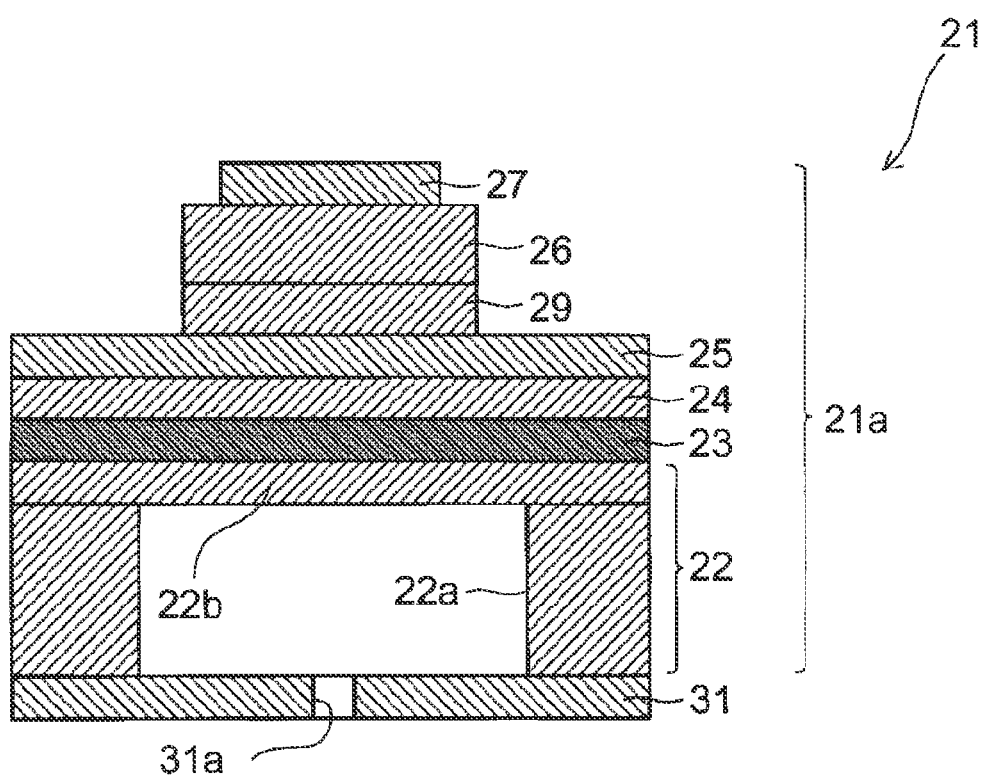
FIG. 7 is a cross-sectional view showing another structure of the inkjet head.

FIG. 7 is a cross-sectional view showing another structure of the inkjet head 21 (actuator 21a) of an embodiment. As shown in the drawing, an orientation control layer 29 may be provided between the lower electrode 25 and the piezoelectric thin film 26. The orientation control layer 29 is formed to control the crystal orientation of the piezoelectric thin film 26 and includes, for example, lead lanthanum titanate (PLT). The method of manufacturing the inkjet head 21 of the structure shown in FIG. 7 is the same as that described with reference to FIG. 6, except that the step of forming the orientation control layer 29 is added between the lower electrode 25-forming step and the piezoelectric thin film 26-forming step. The orientation control layer 29 can be deposited under the same conditions as those for the piezoelectric thin film 26, except that it is made of a material different from that of the piezoelectric thin film 26.

When the orientation control layer 29 is provided, the precipitation of Ti from the bonding layer 24 onto the lower electrode 25 and the improvement of the crystallinity of the lower electrode 25 allow the orientation control layer 29 to have improved crystallinity (orientation). In particular, PLT used to form the orientation control layer 29 has the same perovskite structure as PZT used to form the piezoelectric thin film 26 and also has a lattice constant close to that of PZT. Therefore, PLT can be expected to have the same crystallinity (orientation)-improving effect as that of PZT in the case where the orientation control layer 29 is not formed. The improvement of the crystallinity of the orientation control layer 29 leads to the improvement of the crystallinity of the piezoelectric thin film 26 deposited thereon, so that the piezoelectric thin film 26 can have further improved properties.

[Examples]

Next, examples of the inkjet head 21 (actuator 21a) will be described together with comparative examples. In the examples and the comparative examples below, the inkjet head 21 of FIG. 7 containing the orientation control layer 29 made of PLT was produced, in which the thickness t1 (nm) of the bonding layer 24, the thickness t2 (nm) of the lower electrode 25, the lower electrode 25 deposition temperature (° C.), and the Pt crystal grain size (nm) of the lower electrode 25 were changed as shown in Tables 1 and 2. In each of the examples and the comparative examples, evaluations were performed on the precipitation of Ti from the bonding layer 24 onto the lower electrode 25 and the (100) intensity of PLT in the orientation control layer 29. The thickness of PLT was 100 nm in all the examples and the comparative examples.

In the evaluation of the precipitation of Ti, the surface of the lower electrode 25 was observed with an SEM and then evaluated based on the criteria below.

(Criteria for Evaluation of Ti Precipitation)

○: Ti particles (about 10 nm in diameter) are observed in the form of islands smaller than the Pt crystal grain size.

x: No Ti particles are observed.

The (100) intensity of PLT was evaluated based on the criteria below.

(Criteria for Evaluation of PLT (100) Intensity)

○: The XRD peak intensity is 3,000 or more.

x: The XRD peak intensity is less than 3,000.

The XRD peak intensity refers to the intensity of the peak showing the perovskite (100) orientation of PLT, which is obtained by X-ray diffraction (XRD) 2θ/θ measurement of PLT and expressed as X-ray counts per second (cps). In this case, the XRD peak intensity standard was set at 3,000, considering that the (100) intensity of PLT varies with the thickness of PLT.

TABLE 1

| | Units | Comparative Example 1 | Comparative Example 2 | Example 1 | Example 2 | Comparative Example 3 |
|---|---|---|---|---|---|---|
| Ti thickness (t1) | nm | 20 | 10 | 5 | 10 | 5 |

TABLE 1-continued

|  | Units | Comparative Example 1 | Comparative Example 2 | Example 1 | Example 2 | Comparative Example 3 |
|---|---|---|---|---|---|---|
| Pt thickness (t2) | nm | 50 | 50 | 50 | 150 | 150 |
| t1/t2 | — | 1/2.5 | 1/5 | 1/10 | 1/15 | 1/30 |
| Pt deposition temperature | ° C. | 600 | 600 | 600 | 600 | 600 |
| Pt crystal grain size | nm | 54 | 58 | 91 | 129 | 170 |
| Ti precipitation | — | ○ | ○ | ○ | ○ | X |
| PLT (100) intensity | (count) | X (1100) | X (1300) | ○ (5500) | ○ (3100) | X (200) |

TABLE 2

|  | Units | Example 2 | Comparative Example 4 |
|---|---|---|---|
| Ti thickness (t1) | nm | 10 | 2.5 |
| Pt thickness (t2) | nm | 150 | 50 |
| t1/t2 | — | 1/15 | 1/20 |
| Pt deposition temperature | ° C. | 600 | 600 |
| Pt crystal grain size | nm | 129 | 110 |
| Ti precipitation | — | ○ | X |
| PLT (100) intensity | — | ○ (3100) | X (500) |

Table 1 shows that good results (○) on the PLT (100) intensity are obtained when Ti precipitation occurs and the Pt crystal grain size is 91 nm or more. The PLT (100) intensity is good (○) in Example 1 where the Pt crystal grain size is 91 nm, but poor (x) in Comparative Example 2 where the Pt crystal grain size is 58 nm. These results suggest that the PLT (100) intensity would be generally good when the Pt crystal grain size is 75 nm (a value between 58 nm and 91 nm) or more. The PLT (100) intensity is also good (○) in Example 2 where the Pt crystal grain size is 129 nm, but poor (x) in Comparative Example 3 where the Pt crystal grain size is 170 nm. These results suggest that the PLT (100) intensity would be generally good when the Pt crystal grain size is 150 nm (a value between 129 nm and 170 nm) or less.

It is therefore concluded that when Ti precipitates from the bonding layer 24 onto the lower electrode 25 and the lower electrode 25 has a Pt crystal grain size of 75 nm to 150 nm, a high PLT (100) intensity can be obtained, so that the PLT can have high crystallinity (orientation) and thus improved properties. It is therefore also concluded that the PZT (piezoelectric thin film 26) deposited on the PLT (orientation control layer 29) can also have high crystallinity (orientation) and thus improved properties. Table 1 suggests that the Pt crystal grain size should preferably be in the range of 90 nm to 130 nm, more preferably in the range of 91 nm to 129 nm Table 1 also shows that the PLT (100) intensity is good (○) in Example 1 where the thickness ratio t1/t2 is 1/10, but poor (x) in Comparative Example 2 where the thickness ratio t1/t2 is 1/5. These results suggest that the PLT (100) intensity would be generally good when the thickness ratio t1/t2 is 1/8 (a value between 1/10 and 1/5) or less. Table 2 shows that the PLT (100) intensity is good (○) in Example 2 where the thickness ratio t1/t2 is 1/15, but poor (x) in Comparative Example 4 where the thickness ratio t1/t2 is 1/20. These results suggest that the PLT (100) intensity would be generally good when the thickness ratio t1/t2 is 1/17 (a value between 1/20 and 1/15) or more.

It is therefore concluded that when the thickness ratio t1/t2 is from 1/17 to 1/8, a high PLT (100) intensity can be reliably obtained. Tables 1 and 2 also suggest that the thickness ratio t1/t2 should preferably be in the range of 1/15 to 1/10.

In the above examples, the PLT (100) intensity is evaluated when the orientation control layer 29 is provided on the lower electrode 25. However, it is also suggested that even when the orientation control layer 29 is not provided on the lower electrode 25 (even when the piezoelectric thin film 26 of PZT is formed directly on the lower electrode 25), the evaluation of the crystallinity (orientation) of the PZT would be as good as in the case where the orientation control layer 29 is provided, because PLT and PZT both have a perovskite crystal structure and their lattice constants are close to each other.

The piezoelectric device, the inkjet head, the inkjet printer, and the method of manufacturing a piezoelectric device according to an embodiment described above may be expressed as follows, whereby the following advantageous effects will be achieved.

The piezoelectric device of an embodiment includes a substrate, a bonding layer including titanium, a lower electrode including platinum, a piezoelectric thin film, and an upper electrode, wherein the bonding layer, the lower electrode, the piezoelectric thin film, and the upper electrode are formed in this order on the substrate, titanium from the bonding layer forms a precipitate on the lower electrode, and the platinum that forms the lower electrode has a crystal grain size of 75 nm to 150 nm. The method of manufacturing a piezoelectric device of an embodiment includes the steps of: forming a bonding layer including titanium on a substrate, forming a lower electrode including platinum on the bonding layer, forming a piezoelectric thin film on the lower electrode, and forming an upper electrode on the piezoelectric thin film, wherein the step of forming the lower electrode includes forming the lower electrode in such a way that titanium is precipitated from the bonding layer onto the lower electrode and the platinum has a crystal grain size of 75 nm to 150 nm Ti is precipitated from the bonding layer onto the lower electrode. Therefore, the Ti precipitates can serve as crystal nuclei for crystal growth of the piezoelectric thin film, so that the resulting piezoelectric thin film can have improved crystallinity (orientation). In addition, since Pt in the lower electrode has a crystal grain size of 75 nm to 150 nm, the piezoelectric thin film can be deposited thereon so as to follow the crystallinity of the lower electrode, so that the resulting piezoelectric thin film can have improved crystallinity (orientation). Therefore, even when Ti is precipitated from the bonding layer onto the lower electrode, the effect of improving the properties of the piezoelectric thin film by Ti precipitation and the effect of improving the properties of the piezoelectric thin film based on the crystallinity of the lower electrode can be sufficiently achieved at the same time.

In the method of manufacturing a piezoelectric device, the lower electrode is preferably formed by sputtering. In this case, the control of the temperature of Pt deposition for the lower electrode makes it possible to set the Pt crystal grain size in the desired range and to allow Ti to precipitate from the bonding layer onto the lower electrode.

In the piezoelectric device and the method of manufacturing it, the piezoelectric thin film may include lead zirconate titanate (PZT). PZT, which has a perovskite structure, can provide good piezoelectric properties.

In the piezoelectric device, an orientation control layer for controlling the orientation of the piezoelectric thin film may be provided between the lower electrode and the piezoelectric thin film. The method of manufacturing a piezoelectric device may further include the step of providing an orientation control layer for controlling the orientation of the piezoelectric thin film between the lower electrode and the piezoelectric thin film.

In this case, the precipitation of Ti can improve the properties of the orientation control layer, which can further improve the properties of the piezoelectric thin film. Therefore, due to the crystallinity of the lower electrode, the orientation control layer can have improved properties, so that the piezoelectric thin film can have further improved properties.

In the piezoelectric device and the method of manufacturing it, the orientation control layer may include lead lanthanum titanate (PLT). Since PLT has a perovskite structure, a piezoelectric thin film with a perovskite structure capable of showing good piezoelectric properties can be easily formed on the orientation control layer (PLT).

In the piezoelectric device and the method of manufacturing it, the thickness ratio t1/t2 is preferably from 1/17 to 1/8, wherein t1 represents the thickness (nm) of the bonding layer, and t2 represents the thickness (nm) of the lower electrode.

If t1/t2 is less than the lower limit, the bonding layer may be too thin, so that Ti may hardly precipitate from the bonding layer onto the lower electrode during the deposition of the lower electrode. On the other hand, if t1/t2 is more than the upper limit, the bonding layer may be too thick, so that the amount of Ti precipitation may be large during the deposition of the lower electrode, which may significantly reduce the crystallinity of the lower electrode (this may be because Pt crystal growth of the lower electrode can be inhibited by Ti passing through the lower electrode during the precipitation of Ti on the lower electrode). Therefore, t1/t2 should be kept in the specified range, so that the effect of improving the piezoelectric properties by Ti precipitation and the effect of improving the piezoelectric properties based on the crystallinity of the lower electrode can be sufficiently and reliably achieved at the same time.

In the method of manufacturing a piezoelectric device, the lower electrode is preferably deposited at a temperature of 500° C. to 700° C. When the deposition temperature is 500° C. or higher, crystal growth of the lower electrode can be accelerated to allow the lower electrode to have improved crystallinity, which can improve the properties of the piezoelectric thin film. When the deposition temperature is 700° C. or lower, Pt hillocks (projections) can be prevented from forming on the surface of the lower electrode. As a result, the bonding between the lower electrode and the upper layer (e.g., the piezoelectric thin film) can be prevented from decreasing during the actuation.

The inkjet head of an embodiment includes the piezoelectric device described above and a nozzle substrate having a nozzle hole for ejecting ink to the outside from an opening that is formed in the substrate of the piezoelectric device to contain the ink. The features of the piezoelectric device described above make it possible to sufficiently achieve, at the same time, the effect of improving the piezoelectric properties by the precipitation of Ti from the bonding layer onto the lower electrode and the effect of improving the piezoelectric properties based on the crystallinity of the lower electrode, which makes it possible to obtain a large output (a large amount of ink ejection) even at low-voltage actuation.

The inkjet printer of an embodiment includes the inkjet head described above and is configured to eject ink from the inkjet head to a recording medium.

INDUSTRIAL APPLICABILITY

The present invention is applicable to, for example, actuators for MEMSs (actuators for inkjet printers and projectors), piezoelectric devices for MEMS sensors (pyroelectric sensors and ultrasonic sensors), and the manufacture of them.

REFERENCE SIGNS LIST

1 Inkjet printer
21 Inkjet head
21a Actuator (piezoelectric device)
22 Substrate
22a Pressure chamber (opening)
24 Bonding layer
25 Lower electrode
26 Piezoelectric thin film
27 Upper electrode
29 Orientation control layer
31 Nozzle substrate
31a Ejection hole (nozzle hole)

The invention claimed is:

1. A piezoelectric device comprising: a substrate; a bonding layer comprising titanium; a lower electrode comprising platinum; a piezoelectric thin film; and an upper electrode, wherein the bonding layer, the lower electrode, the piezoelectric thin film, and the upper electrode are formed in this order on the substrate,
   titanium from the bonding layer forms a precipitate on the lower electrode,
   the lower electrode includes particles of titanium not exposed on a surface of the lower electrode, and
   the platinum that forms the lower electrode has a crystal grain size of 75 nm to 150 nm.

2. The piezoelectric device according to claim 1, wherein the piezoelectric thin film comprises lead zirconate titanate.

3. The piezoelectric device according to claim 1, further comprising an orientation control layer for controlling orientation of the piezoelectric thin film between the lower electrode and the piezoelectric thin film.

4. The piezoelectric device according to claim 3, wherein the orientation control layer comprises lead lanthanum titanate.

5. The piezoelectric device according to claim 4, wherein the peak intensity of the (100) orientation of the lead lanthanum titanate in X-ray diffraction measurement is 3000 (cps) or more.

6. The piezoelectric device according to claim 1, which has a thickness ratio t1/t2 of 1/17 to 1/8, wherein t1 represents the thickness (nm) of the bonding layer, and t2 represents the thickness (nm) of the lower electrode.

7. An inkjet head comprising:
   the piezoelectric device according to claim 1; and
   a nozzle substrate having a nozzle hole for ejecting ink to outside from an opening that is formed in the substrate of the piezoelectric device to contain the ink.

8. An inkjet printer comprising the inkjet head according to claim 7, the inkjet printer being configured to eject ink from the inkjet head to a recording medium.

9. The piezoelectric device according to claim 1, wherein the particles of titanium precipitated on the lower electrode comprise particles of titanium in which the entire particle protrudes from the surface of the lower electrode.

10. The piezoelectric device according to claim 1, wherein the particles of titanium precipitated on the lower electrode have a grain size smaller than the crystal grain size of the platinum.

11. The piezoelectric device according to claim 1, wherein the bonding layer has a thickness of 5 nm to 10 nm, and the lower electrode has a thickness of 50 nm to 150 nm.

12. The piezoelectric device according to claim 1, wherein the lower electrode has a thickness that allows titanium of the bonding layer to pass therethrough during the manufacturing of the piezoelectric device.

13. The piezoelectric device according to claim 1, wherein the upper electrode comprises a titanium layer and a platinum layer.

14. A method of manufacturing a piezoelectric device, the method comprising:
   forming a bonding layer comprising titanium on a substrate; forming a lower electrode comprising platinum on the bonding layer;
   forming a piezoelectric thin film on the lower electrode; and
   forming an upper electrode on the piezoelectric thin film, wherein
   the forming the lower electrode comprises forming the lower electrode in such a way that titanium is precipitated from the bonding layer onto the lower electrode, the lower electrode includes particles of titanium not exposed on a surface of the lower electrode, and the platinum has a crystal grain size of 75 nm to 150 nm.

15. The method of manufacturing a piezoelectric device according to claim 14, wherein the lower electrode is formed by sputtering.

16. The method of manufacturing a piezoelectric device according to claim 14, wherein the piezoelectric thin film comprises lead zirconate titanate.

17. The method of manufacturing a piezoelectric device according to claim 14, further comprising the step of providing an orientation control layer for controlling orientation of the piezoelectric thin film between the lower electrode and the piezoelectric thin film.

18. The method of manufacturing a piezoelectric device according to claim 17, wherein the orientation control layer comprises lead lanthanum titanate.

19. The method of manufacturing a piezoelectric device according to claim 14, wherein the bonding layer and the lower electrode provide a thickness ratio t1/t2 of 1/17 to 1/8, wherein t1 represents the thickness (nm) of the bonding layer, and t2 represents the thickness (nm) of the lower electrode.

20. The method of manufacturing a piezoelectric device according to claim 14, wherein the lower electrode is deposited at a temperature of 500° C. to 700° C.

* * * * *